Sept. 12, 1961 M. WEISS 2,999,968
SWITCHING CIRCUIT FOR NONLINEAR SERVO INTEGRAL COMPENSATION
Filed Oct. 19, 1959
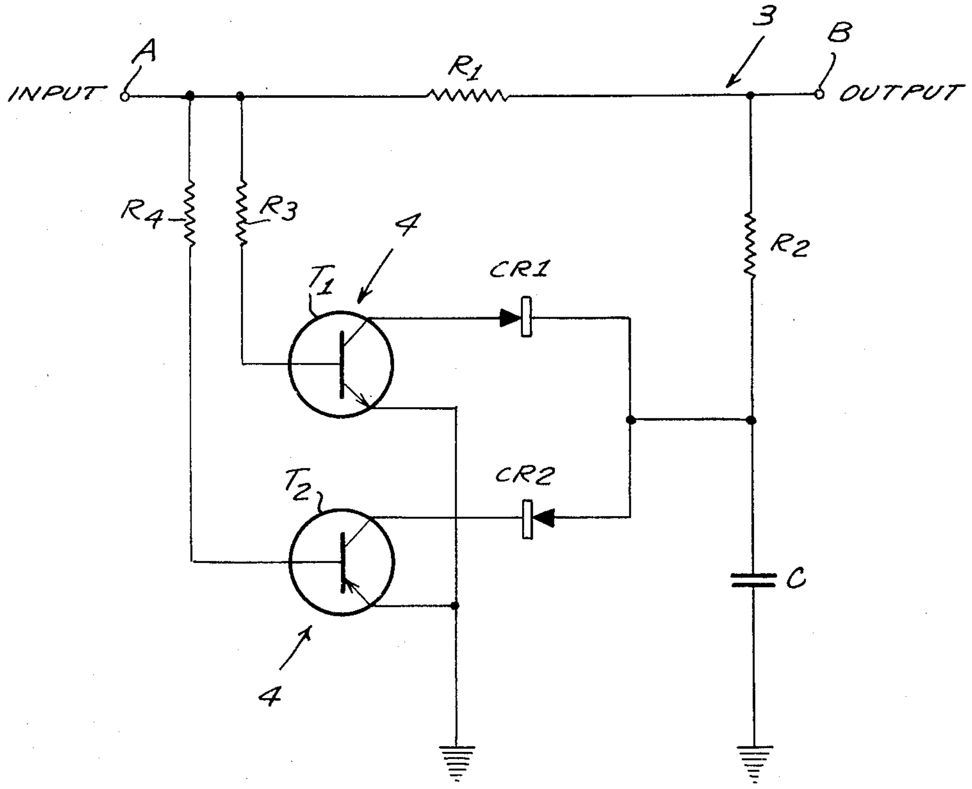
INVENTOR.
MARVIN WEISS
BY Brast & Brast
ATTORNEYS 2,999,968
Patented Sept. 12, 1961

2,999,968

SWITCHING CIRCUIT FOR NONLINEAR SERVO INTEGRAL COMPENSATION

Marvin Weiss, Pearl River, N.Y., assignor to Sperry Rand Corporation, Ford Instrument Company Division, Wilmington, Del., a corporation of Delaware Filed Oct. 19, 1959, Ser. No. 847,333
3 Claims. (Cl. 320—1)

This invention relates to amplifier circuits used in feedback control systems and particularly to circuits of that general character which are capable of deriving from their applied input an integrated signal which is combined with the input for the purpose of obtaining increased amplification.

Circuits which employ resistor-capacitor components to increase gain at low frequency by virtue of the ability of the capacitor to store voltage and add the stored voltage to the applied input voltage are frequently used in feedback control systems but have a serious limitation. The limitation is due to the necessity that the polarity of the input voltage and the stored capacitor voltage be the same so that the latter may be permitted to aid the former. It may be seen that if the polarity of the input signal and the stored capacitor voltage should become opposed due to some transient effect, the stored voltage, which is the integrated signal, will oppose the applied voltage and for a short period reduce instead of increase the gain of the circuit. The utility of the usual integration circuit is thus limited to a condition of operation in which the applied signal is static or varies slowly. For this reason these circuits have earned the reputation for being useful solely for low frequencies inasmuch as high frequency operation can result in opposed polarities on the input side and across the capacitor integrators.

According to this invention the usefulness of the conventional integrator circuit is improved by the provision of a specially designed switching circuit which allows the integrated or stored signal from the capacitor of the circuit to be added to the input signal when their voltages have the same polarity and which causes the capacitor to be discharged to zero potential when different polarities exist.

There follows a more complete description of the invention which is taken in connection with the accompanying drawing which is a schematic of the improved integration circuit.

Referring to the drawing, a D.C. input voltage is applied to input terminal A which is connected to a conventional integration circuit 3 having a resistor $R_1$ connected to the input terminal A and a series combination consisting of resistor $R_2$ and grounded capacitor C connected between the resistor $R_1$ and the output terminal B.

Connected between the input terminal A and the capacitor C is a unique switching circuit 4. This circuit comprises a pair of transistors $T_1$ and $T_2$ having grounded emitters, their collectors being connected through half wave, diode rectifiers $CR_1$ and $CR_2$, respectively, to the integration circuit 3 at a point between the resistor $R_2$ and capacitor C. The base electrodes of the transistors $T_1$ and $T_2$ are connected to the input terminal A through resistors $R_3$ and $R_4$, respectively. The diode rectifier $CR_1$ is poled in the direction of the junction of resistor $R_2$ and the capacitor C while the diode rectifier $CR_2$ is poled in the direction of the transistor $T_2$. The transistor $T_1$ is a junction transistor of the NPN type and the transistor $T_2$ is also a junction transistor but of the PNP type.

It may be seen that the switching circuit operates to discharge the capacitor and thus prevent it from passing its stored voltages to the output when the polarities of the applied signal and capacitor voltages are opposed.

There are four possible conditions of operation. One condition obtains where the input voltage is positive and the capacitor voltage $V_c$ is also positive. It is here seen that the transistor $T_1$ will be saturated but that the rectifier $CR_1$ will prevent the capacitor from discharging; the transistor $T_2$ will be cut off which also prevents capacitor discharge. A second condition is present assuming the input and capacitor voltages are both negative. Under this condition, the transistor $T_1$ is cut off thus preventing capacitor discharge through its path; although the transistor $T_2$ is saturated, the rectifier $CR_2$ will prevent capacitor discharge. On the other hand if the two other possible conditions are examined it will be seen that capacitor discharge is effected. Concider the third condition which is that the input voltage is positive while the capacitor voltage is negative. Here the transistor $T_1$ is saturated allowing current to flow from ground through the rectifier $CR_1$ which will cause the capacitor to be instantly discharged. The cutting off of $T_2$ will have no effect. The final condition is the application of a negative voltage to the input side of the circuit while the capacitor voltage is positive. Under this condition the transistor $T_2$ is saturated so that ground current is allowed to flow through the rectifier $CR_2$ to discharge the capacitor. The transistor $T_1$ is then cut off. The circuit is thus seen to operate in such a manner that the switching circuit 4 will have no effect when the capacitor voltage is aiding the input voltage but will instantly discharge the capacitor in the integration circuit when the integration voltage opposes the input voltage.

It is evident that other circuit arrangements could be effected by persons skilled in the art to achieve the objective of the circuit described above so as to switch on and off the capacitor voltage in an integration circuit in accordance with the polarity of the latter relative to the applied signal. The breadth of this invention is therefore to be measured solely in terms of the scope of the claims appended hereto.

What is claimed is:

1. An integration circuit having an input terminal, an output terminal and a ground terminal, a resistor connected between said input and said output terminals, a series resistor and capacitor combination connected between said ground terminal and said output terminal, a switching circuit connected between said input terminal and capacitor, said switching circuit comprising a pair of parallel disposed transistors having their emitters connected to said ground terminal and their bases conected to said input terminal through a pair of parallel disposed resistors, said transistors requiring opposite bias polarity for operation, a rectifier connected between a collector of one of said transistors and said capacitor and a second rectifier poled oppositely to said first-mentioned rectifier and connected between a collector of the second transistor and said capacitor.

2. An integration circuit of the character described comprising an input terminal which is adapted to have a D.C. input voltage applied thereto, an output terminal, and a ground terminal, a storage capacitor interposed between said output terminal and said ground terminal, and a transistorized switching means interposed between said capacitor and said input terminal, said switching means being operative to add the capacitor voltage to the input voltage when the input voltage and the capacitor voltage have the same polarity and to instantly discharge said capacitor to zero potential through said ground terminal when the polarity of the capacitor voltage is opposite to the polarity of the input voltage.

3. An integration circuit of the character described comprising an input terminal which is adapted to have a D.C. input voltage applied thereto; an output terminal, a ground terminal, a storage capacitor interposed in said circuit between said ground terminal and said output terminal, and a switching means interposed in said circuit between said capacitor and said input terminal; said switching means comprising a pair of transistors, one of which is operative to effect the combining of the capacitor voltage with the input voltage when the polarity of both of said voltages is positive and the other of which is operative to effect the combining of said capacitor voltage and said input voltage when the polarity of both of said voltages is negative, and said transistors being operative in combination to effect the instant discharge of said capacitor voltage to the ground when the polarity of said capacitor voltage is opposite to the polarity of said input voltage.

References Cited in the file of this patent

UNITED STATES PATENTS 2,823,319 Vossberg -------------- Feb. 11, 1958